United States Patent
Hou (10) Patent No.: US 8,304,266 B2
(45) Date of Patent: Nov. 6, 2012

(54) MANUFACTURING METHOD OF THIN FILM TRANSISTOR SUBSTRATE OF LIQUID CRYSTAL DISPLAY PANEL

(75) Inventor: Sheng-Hsiung Hou, Kaohsiung (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 41 days.

(21) Appl. No.: 12/981,481

(22) Filed: Dec. 30, 2010

(65) Prior Publication Data

US 2012/0028385 A1    Feb. 2, 2012

(30) Foreign Application Priority Data

Jul. 29, 2010   (TW) ................................ 99125141 A (51) Int. Cl.
  *H01L 21/336*   (2006.01)
  *H01L 21/84*    (2006.01)
  *H01L 29/786*   (2006.01)
  *H01L 31/0224*  (2006.01)

(52) U.S. Cl. .......... 438/30; 438/155; 438/609; 438/717; 257/E21.036; 257/E21.233; 257/E21.259

(58) Field of Classification Search .................... 438/22, 438/23, 29, 30, 689, 717, 725, 780, 942, 438/945, 950, FOR. 459, FOR. 473; 257/43, 257/103, 79, 13, 918, E33.062, E33.063, 257/E33.064, E33.065, E21.023, E21.026, 257/E21.027, E21.036, E21.038, E21.232, 257/E21.233, E21.235, E21.258, E21.259; 349/38, 39, 43, 46, 48

See application file for complete search history.

(56) References Cited

U.S. PATENT DOCUMENTS

| | | | |
|---|---|---|---|
| 6,400,424 B1 * | 6/2002 | Kim et al. | ........................ 349/38 |
| 7,501,655 B2 | 3/2009 | Kim | |
| 7,888,679 B2 | 2/2011 | Park | |
| 2011/0031493 A1 * | 2/2011 | Yamazaki et al. | .............. 257/43 |

FOREIGN PATENT DOCUMENTS

TW    I275182    3/2007

OTHER PUBLICATIONS

Sheng-Hsiung Hou, Title: Thin Film Transistor Substrate of Liquid Crystal Display Panel, pending U.S. Appl. No. 12/981,517, filed Dec. 30, 2010.

\* cited by examiner

*Primary Examiner* — Olik Chaudhuri
*Assistant Examiner* — Quovaunda V Jefferson
(74) *Attorney, Agent, or Firm* — Winston Hsu; Scott Margo (57) ABSTRACT

A manufacturing method of thin film transistor substrate of a liquid crystal display panel includes following steps. A substrate is provided. Then, a transparent conducting layer and an opaque conducting layer are formed on the substrate. Thereafter, the transparent conducting layer and the opaque conducting layer are patterned by a gray-tone mask to form at least one storage capacitor electrode. Next, a first insulating layer is formed on the storage capacitor electrode. Then, at least one gate electrode is formed on the substrate. Subsequently, at least one gate insulating layer, a patterned semiconductor layer, a source electrode, a drain electrode, and a second insulating layer are formed sequentially on the gate electrode. Moreover, at least one pixel electrode is formed on the first insulating layer and the second insulating layer. A part of the pixel electrode overlaps a part of the storage capacitor electrode to form a storage capacitor.

6 Claims, 11 Drawing Sheets

MANUFACTURING METHOD OF THIN FILM TRANSISTOR SUBSTRATE OF LIQUID CRYSTAL DISPLAY PANEL

BACKGROUND OF THE INVENTION

1. Field of the Invention

The present invention relates to a manufacturing method of thin film transistor substrate of a liquid crystal display panel, and more particularly, to a manufacturing method of thin film transistor substrate of a liquid crystal display panel which is capable of improving the aperture ratio.

2. Description of the Prior Art

Because of the advantages of low radiation, small size, and low power consumption, liquid crystal display panels have been widely applied to various electronic products, such as notebooks, personal digital assistants, flat televisions, and mobile phones. Generally, a liquid crystal display panel includes a thin film transistor substrate, a color filter substrate, and a liquid crystal layer disposed between the thin film transistor substrate and the color filter substrate. Moreover, the thin film transistor substrate has a plurality of pixel areas defined thereon, and a back light module is further disposed on a side of the liquid crystal display panel to provide back light. Accordingly, through controlling the voltage applying to the liquid crystal layer of each pixel area, corresponding gray scale can be obtained for each pixel area to display images. Furthermore, in order to maintain the voltage to the next frame, storage capacitors are usually disposed in each pixel areas of the thin film transistor substrate.

However, the material of the storage capacitor is an opaque metal layer. The opaque metal layer would block light, decrease the aperture ratio of each pixel area, and further reduce the brightness of the liquid crystal display panel. On the other hand, decease of the area of each storage capacitor electrodes may increase the aperture ratio of each pixel area, but this would lead to deterioration of display quality, such as generation of image flicker, because the voltage of the liquid crystal layer cannot be maintained to the next frame.

SUMMARY OF THE INVENTION

It is therefore one of the objectives of the present invention to provide a manufacturing method of thin film transistor substrate of a liquid crystal display panel to solve the problems which the conventional art faces.

In accordance with a preferred embodiment of the present invention, a manufacturing method of a thin film transistor substrate of a liquid crystal display panel includes the following steps. First of all, a substrate is provided. Then, a transparent conducting layer and an opaque conducting layer are formed on the substrate, wherein the opaque conducting layer is disposed on the transparent conducting layer. Thereafter, the transparent conducting layer and the opaque conducting layer are patterned by using a gray-tone mask to form at least one storage capacitor electrode. The storage capacitor electrode includes a patterned transparent conducting layer and a patterned opaque conducting layer, and an area of the transparent conducting layer is larger than an area of the patterned opaque conducting layer. Next, a first insulating layer is formed on the storage capacitor electrode. Then, at least one gate electrode is formed on the substrate. Subsequently, at least one gate insulating layer, a patterned semiconductor layer, a source electrode, a drain electrode, and a second insulating layer are formed sequentially on the gate electrode. Moreover, at least one pixel electrode is formed on the first insulating layer and on the second insulating layer. A part of the pixel electrode overlaps a part of the storage capacitor electrode to form a storage capacitor.

In accordance with a preferred embodiment of the present invention, a thin film transistor substrate of a liquid crystal display panel includes a substrate, a storage capacitor electrode, a first insulating layer, a gate electrode, a gate insulating layer, a patterned semiconductor layer, a source electrode, a drain electrode, a second insulating layer, and a pixel electrode. The storage capacitor electrode is disposed on the substrate. The storage capacitor includes a patterned transparent conducting layer and a patterned opaque conducting layer, the patterned opaque conducting layer is disposed on the transparent conducting layer, and an area of the patterned transparent conducting layer is larger than an area of the patterned opaque conducting layer. The first insulating layer is disposed on the storage capacitor electrode. Also, the gate electrode is disposed on the substrate. The gate insulating layer, the patterned semiconductor layer, the source electrode, the drain electrode, and the second insulating layer are disposed sequentially on the gate electrode. The pixel electrode is disposed on the second insulating layer and on the first insulating layer, and a part of the pixel electrode overlaps a part of the storage capacitor electrode to form a storage capacitor.

According to the thin film transistor substrate of the liquid crystal display panel and a manufacturing method thereof, the patterned transparent conducting layer and the patterned opaque conducting layer can be accomplished by using a gray-tone mask. In comparison with the method of forming the patterned transparent conducting layer and the opaque conducting layer by using the process with two masks, one mask is saved, and process steps are reduced. Also, the electrical difference caused by the misalignment between the patterned transparent conducting layer and the patterned opaque conducting layer is prevented. Moreover, the capacitance of the storage capacitor and the aperture ratio can be both increased by forming the patterned transparent conducting layer with larger area.

These and other objectives of the present invention will no doubt become obvious to those of ordinary skill in the art after reading the following detailed description of the preferred embodiment that is illustrated in the various figures and drawings.

DETAILED DESCRIPTION

Certain terms are applied throughout the following description and claim to refer to particular components. As those of ordinary skill will appreciate, manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ". Moreover, the phrase "electrically connect" includes any direct or indirect means to electrically connect so that if it describe that a first device is electrically connected to a second device in the article, which means, the first device may be directly connected to the second device and also may be indirectly connected to the second device through other devices or by other methods. Furthermore, it is noticeable that the figures are only used for description and not drawn to scale.

Figure 1:
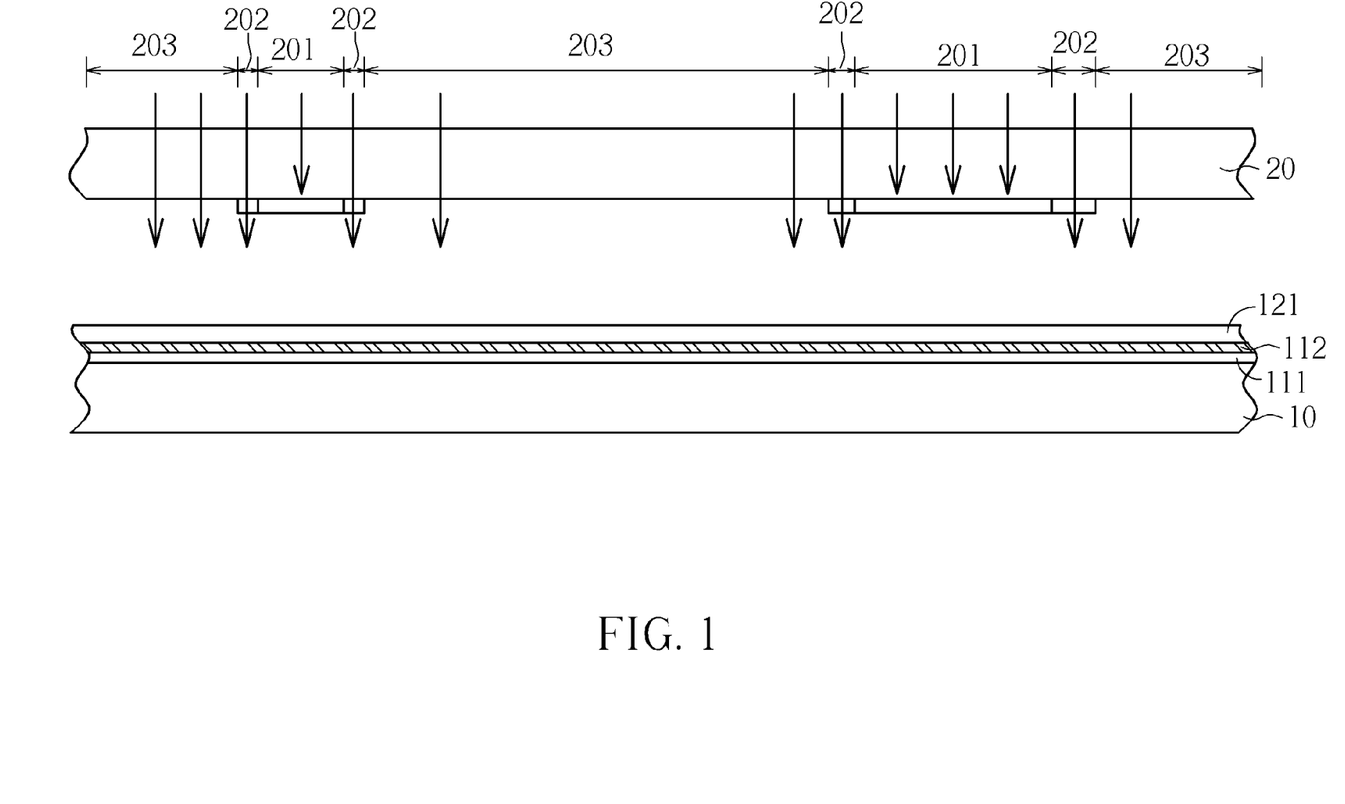
FIGS. 1-6 are schematic diagrams illustrating a manufacturing method of a thin film transistor substrate of a liquid crystal display panel of a first preferred embodiment of the present invention.

Please refer FIGS. 1-6. FIGS. 1-6 are schematic diagrams illustrating a manufacturing method of a thin film transistor substrate of a liquid crystal display panel of a first preferred embodiment of the present invention. As shown in FIG. 1, a substrate 10 is provided. The material of the substrate 10 may be glass, plastic, or quartz, but are not limited thereto and may be any other appropriate materials. Next, a transparent conducting layer 111 and an opaque conducting layer 112 are formed on the substrate 10. The opaque conducting layer 112 is disposed on the transparent conducting layer 111. In this embodiment, the transparent conducting layer 111 is made of transparent conducting materials, such as indium tin oxide (ITO) or zinc oxide (ZnO). Also, the opaque conducting layer 112 may be a metal layer which is made of such as aluminum (Al), chromium (Cr), molybdenum (Mo), tungsten (W), tantalum (Ta), copper (Cu), or alloys thereof. The transparent conducting layer 111 and the opaque conducting layer 112 in the present invention are not limited to the materials mentioned above and could be made of any other appropriate materials. Thereafter, a photo resist layer 121 is formed on the opaque conducting layer 112, and an exposure process is performed on the photo resist layer 121 by using a gray-tone mask (GTM) 20. The gray-tone mask 20 may be a half-tone mask (HTM), but not limited thereto. For example, the gray-tone mask 20 may be a phase shift mask. The gray-tone mask 20 at least has a first area 201, a semitransparent area 202, and a second area 203. It is appreciated that when the photo resist layer 121 is a positive photo resist layer, the first area 201 is a light-shielding area and the second area 203 is a transparent area; on the other hand, when the photo resist layer 121 is a negative photo resist layer, the first area 201 is a transparent area and the second area 203 is a light-shielding area. Moreover, the transmittance of the semitransparent area 202 may be adjusted based on different situations.

Figure 2:
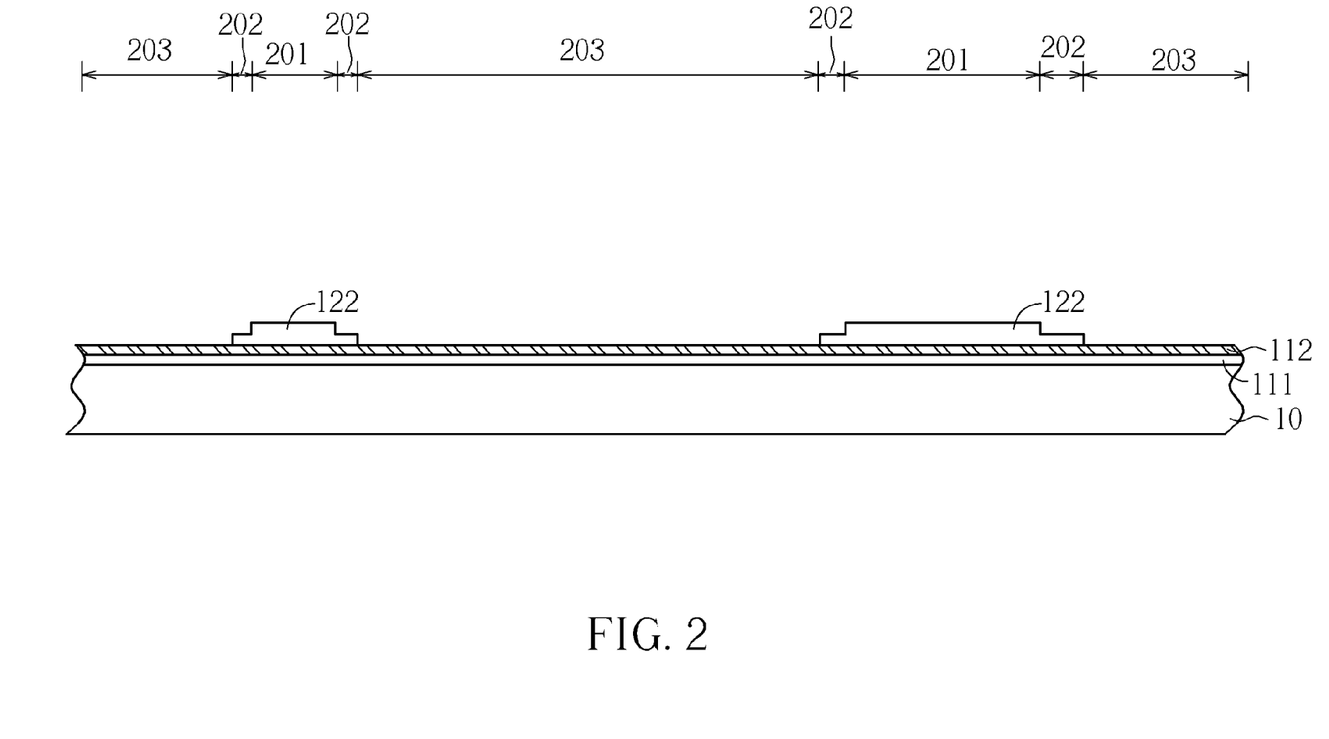
Figure 3A:
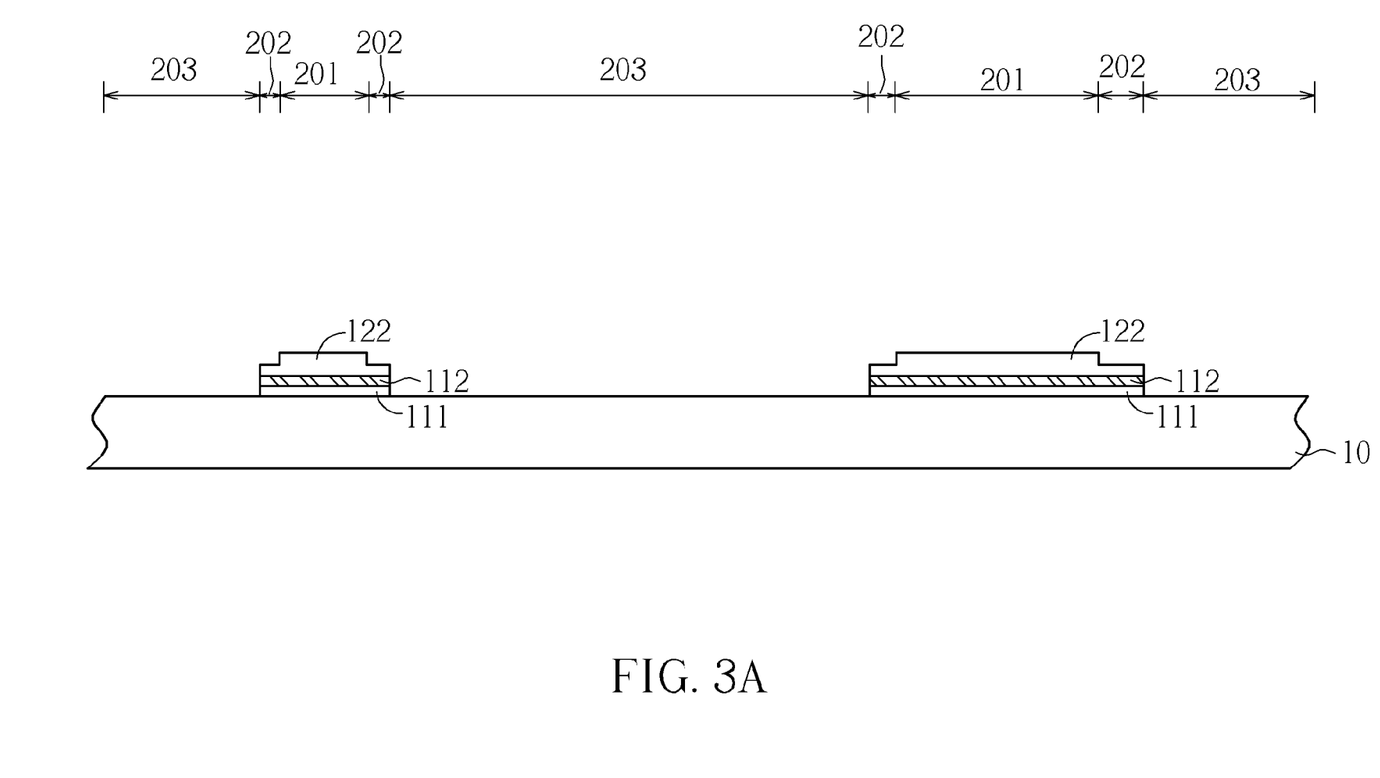

As shown in FIG. 2, after the exposure process, a developing process is implemented to remove a part of the photo resist layer 121 and therefore to form a patterned photo resist layer 122. During the exposure process, the photo resist layer 121 corresponding to the first area 201, the semitransparent area 202 and the second area 203 have different amount of exposure. Consequently, after the developing process, the thickness of the patterned photo resist layer 122 corresponding to the first area 201 is thicker than the thickness of the patterned photo resist layer 122 corresponding to the semitransparent area 202, and the patterned photo resist layer 122 corresponding to the second area 203 is removed. Then, as shown in FIG. 2 and FIG. 3A, the opaque conducting layer 112 and the transparent conducting layer 111 which are not covered by the patterned photo resist layer 122 are removed by an etching process. In this embodiment, the etching process may simultaneously remove the opaque conducting layer 112 and the transparent conducting layer 111 which are not covered by the patterned photo resist layer 122, but not limited thereto. For example, in another embodiment, the etching process may remove the opaque conducting layer 112 not covered by the patterned photo resist layer 122 primarily, and then remove the transparent conducting layer 111 not covered by the patterned photo resist layer 122. Moreover, a dry etching process or a wet etching process may be chosen as the etching process based on the materials of the opaque conducting layer 112 and the transparent conducting layer 111 to be etched.

Figure 3B:
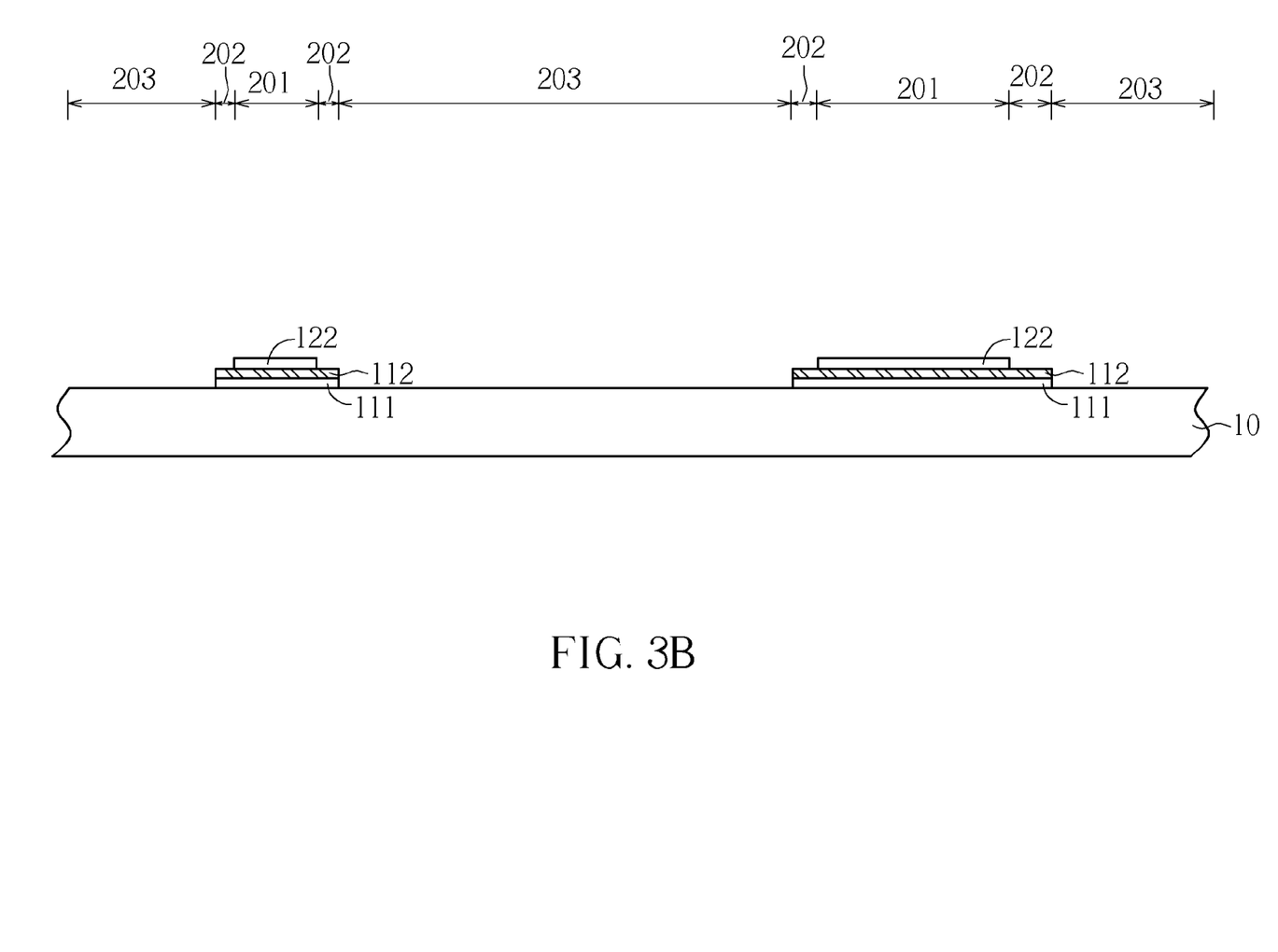
Figure 4:
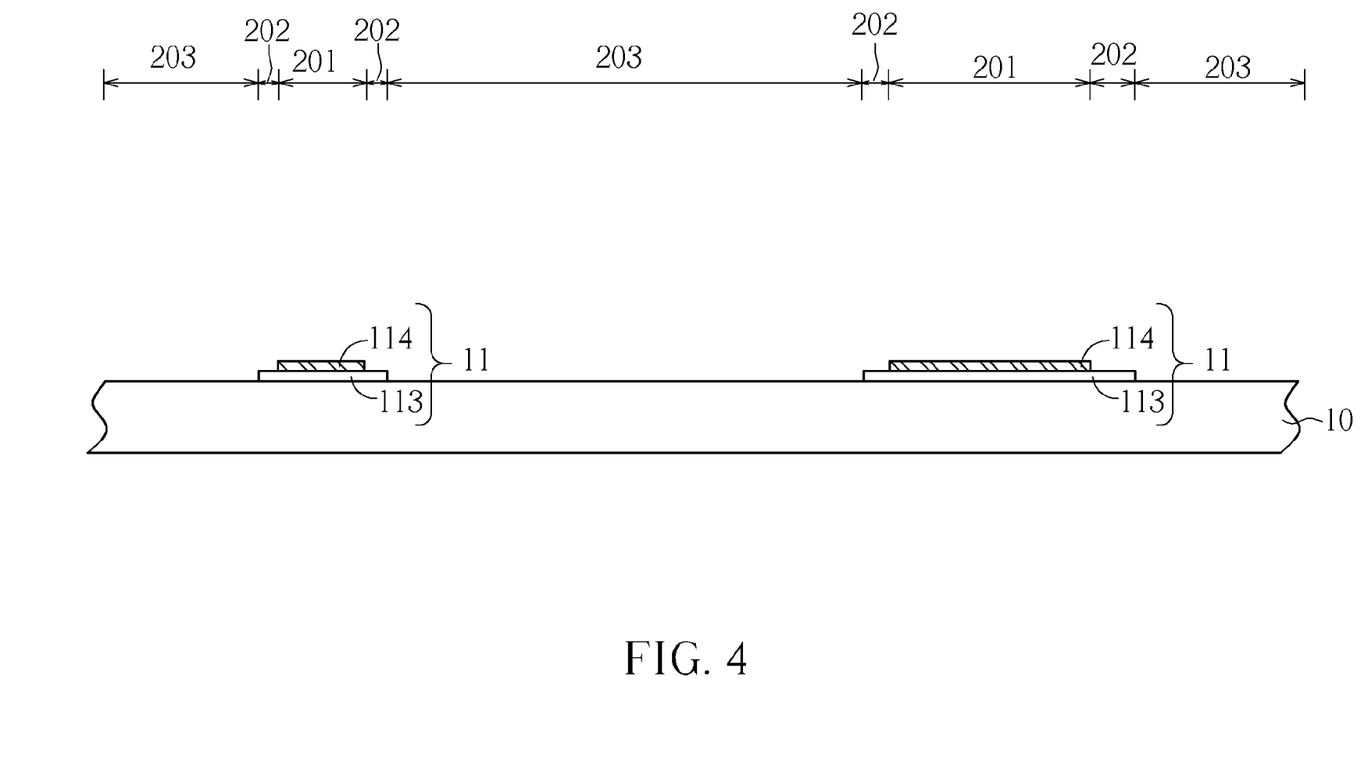

Next, as shown in FIG. 3B, an ashing process is implemented to the patterned photo resist layer 122 to reduce the thickness of the patterned photo resist layer 122 corresponding to the first area 201, and also to remove the patterned photo resist layer 122 corresponding to the semitransparent area 202 to expose a part of the opaque conducting layer 112. Then, as shown in FIG. 3B and FIG. 4, the opaque conducting layer 112 not covered by the patterned photo resist layer 122 is removed by another etching process. Thereafter, the patterned photo resist layer 122 is removed. Accordingly, the present invention uses the gray-tone mask 20 to define the pattern of the transparent conducting layer 111 and the pattern of the opaque conducting layer 112, so as to form at least one storage capacitor electrode 11. The storage capacitor electrode 11 may form a storage capacitor with a pixel electrode to be formed subsequently, and the storage capacitor is able to keep the voltage difference of the pixel electrode during the period of scanning the pixel. In this embodiment, the storage capacitor electrode 11 includes a patterned transparent conducting layer 113 and a patterned opaque conducting layer 114, and an area of the patterned transparent conducting layer 113 is larger than an area of the patterned opaque conducting layer 114. Moreover, the patterned opaque conducting layer 114 of the storage capacitor electrode 11 is substantially corresponding to the first area 201, and the part of the patterned transparent conducting layer 113 of the storage capacitor electrode 11 protruding from the patterned opaque conducting layer 114 is substantially corresponding to the semitransparent area 202.

Figure 5:
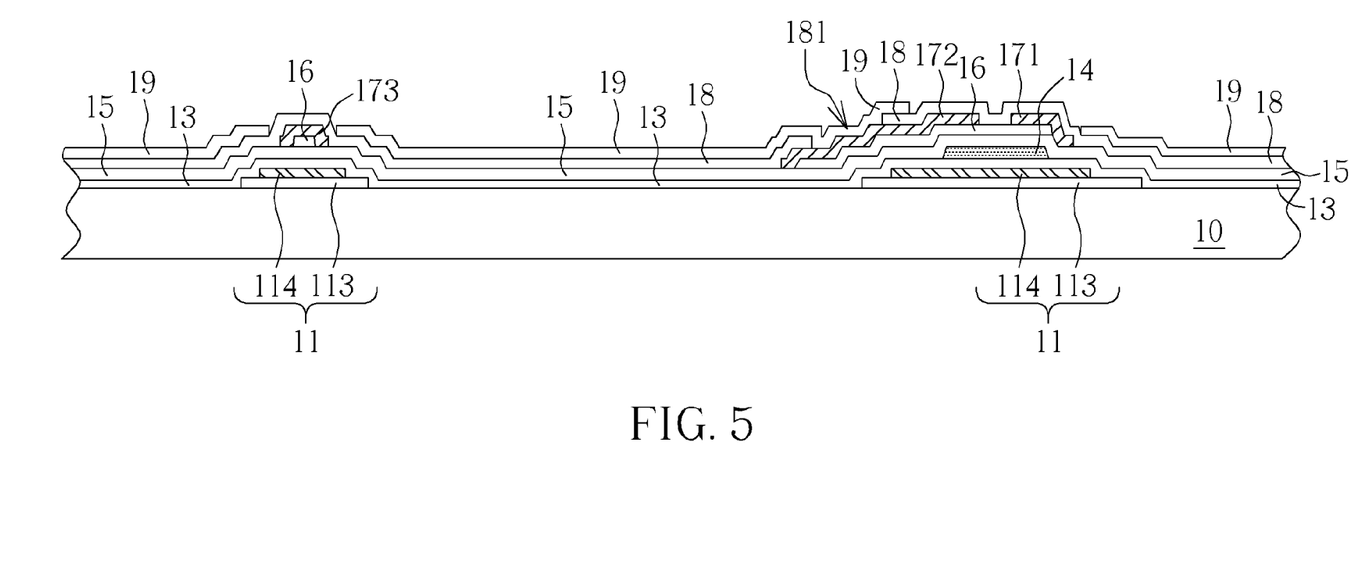
Figure 6:
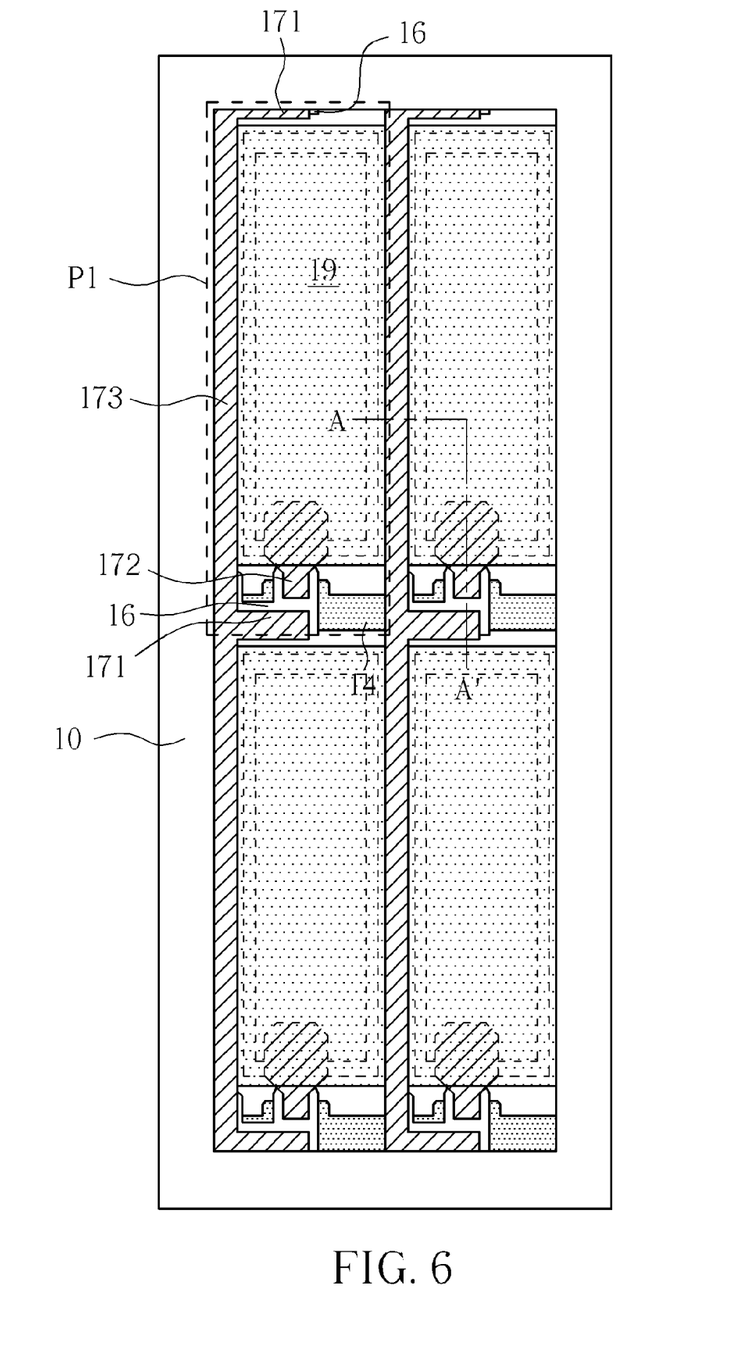

As shown in FIG. 5, a first insulating layer 13 is formed on the storage capacitor electrode 11. The first insulating layer 13 may be a single-layered insulating layer or a composite-layered insulating layer made of materials including silicon oxide, silicon nitride, or silicon oxynitride, but not limited thereto. Then, at least one gate electrode 14 is formed on the substrate 10. In the first preferred embodiment, the gate electrode 14 is formed on the first insulating layer 13 and the gate electrode 14 may be a layer made of metal, such as aluminum (Al), chromium (Cr), molybdenum (Mo), tungsten (W), tantalum (Ta), copper (Cu), or alloys thereof. Next, a gate insulating layer 15, a patterned semiconductor layer 16, a source electrode 171, a drain electrode 172, a data line 173, and a second insulating layer 18 are sequentially formed on the gate electrode 14. The gate insulating layer 15 is mainly used to isolate the gate electrode 14 from the layers formed thereon, such as the patterned semiconductor layer 16, the source electrode 171, and the drain electrode 172. Moreover, the source electrode 171, the drain electrode 172, and the data line 173 are formed by depositing a conducting layer (not shown in figure), and then by patterning the conducting layer with a photo etching process. In other words, the source electrode 171, the drain electrode 172, and the data line 173 could be made of the same conducting layer. Furthermore, the source electrode 171 is electrically connected to the data line 173, which is shown in FIG. 6.

Then, at least one pixel electrode 19 is formed on the second insulating layer 18 and on the first insulating layer 13. A part of the pixel electrode 19 overlaps a part of the storage capacitor electrode 11 to form a storage capacitor. In this preferred embodiment, the pixel electrode 19 is made of a transparent conducting layer, such as indium tin oxide or zinc oxide, but not limited thereto. It is appreciated that the second insulating layer 18 has at least one contact hole 181, and the pixel electrode 19 is electrically connected to the drain electrode 172 via the contact hole 181. Moreover, FIG. 6 illustrates a layout of the thin film transistor substrate of the liquid crystal display panel of the first preferred embodiment. In FIG. 6, four pixels are exemplarily illustrated, and one pixel P1 of four pixels is marked by a dotted frame. In addition, FIGS. 1-5 are cross-sectional views taken along line A-A' in FIG. 6. By virtue of the aforementioned method, the thin film transistor substrate of the liquid crystal display panel of the first preferred embodiment of the present invention is completed.

According to the manufacturing method of forming the thin film transistor substrate of the liquid crystal display panel of the first preferred embodiment, the patterned transparent conducting layer 113 and the patterned opaque conducting layer 114 can be accomplished by using the gray-tone mask 20. In comparison with the method of forming the patterned transparent conducting layer 113 and the opaque conducting layer 114 by using the process with two masks, one mask is saved, and process steps are reduced. Also, the electrical difference caused by the misalignment between the patterned transparent conducting layer 113 and the patterned opaque conducting layer 114 is prevented. The storage capacitor electrode 11 includes the patterned transparent conducting layer 113 and the patterned opaque conducting layer 114, and the area of the patterned transparent conducting layer 113 is larger than the area of the patterned opaque conducting layer 114. Consequently, the capacitance of the storage capacitor formed between the storage capacitor electrode 11 and the pixel electrode 19, and the aperture ratio can be both increased by increasing the area of the patterned transparent conducting layer 113, which is optically transmittable.

Figure 7:
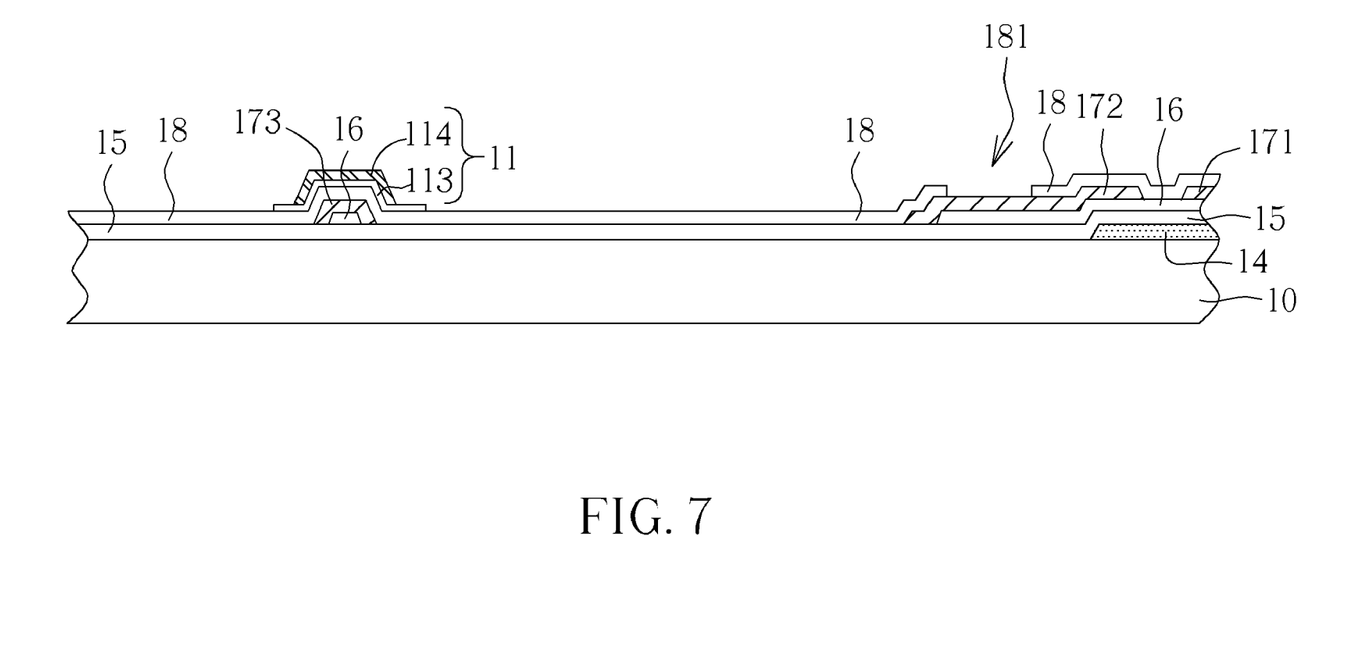
FIGS. 7-10 are schematic diagrams illustrating a manufacturing method of a thin film transistor substrate of a liquid crystal display panel of a second preferred embodiment of the present invention.
Figure 8:
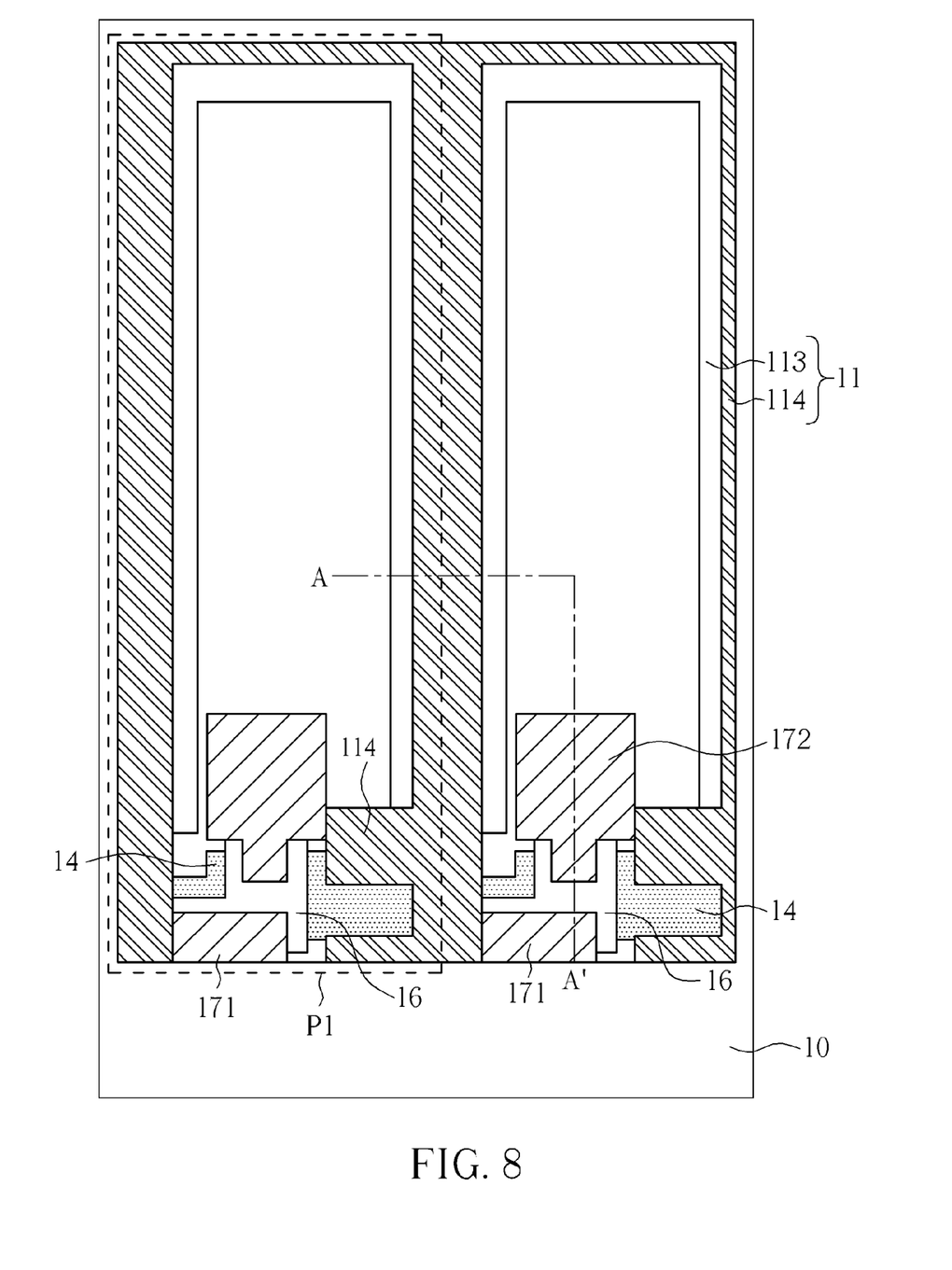
Figure 9:
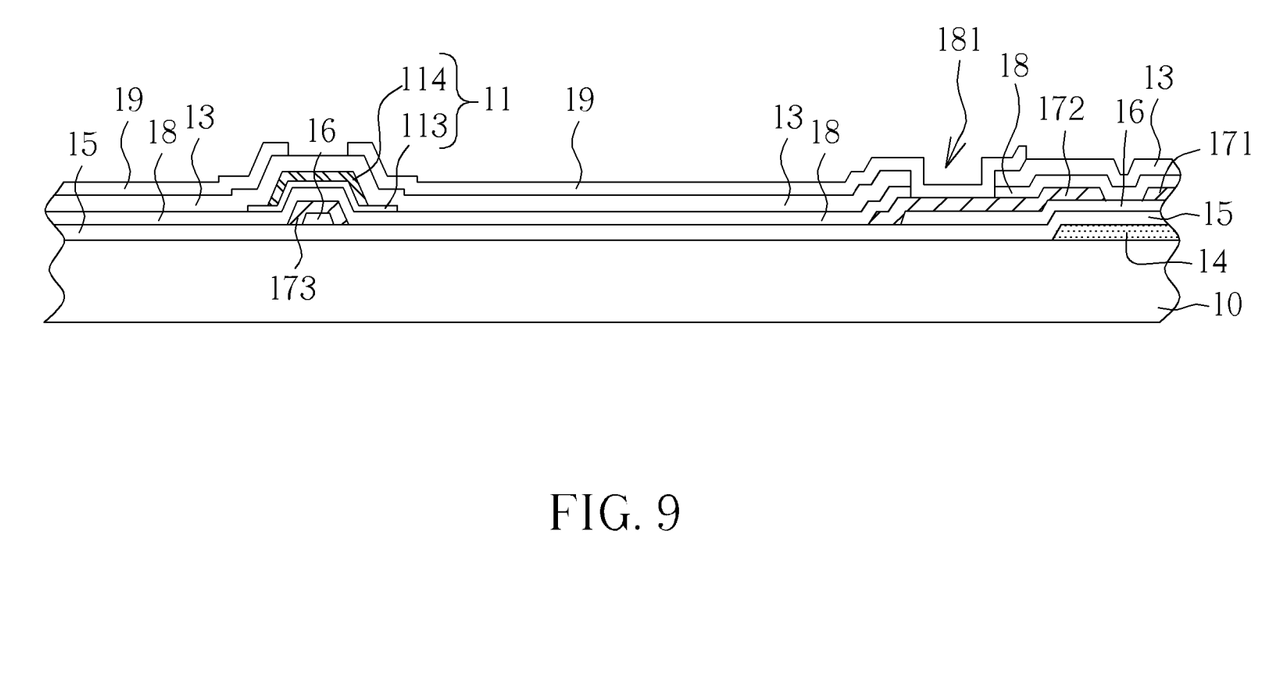
Figure 10:
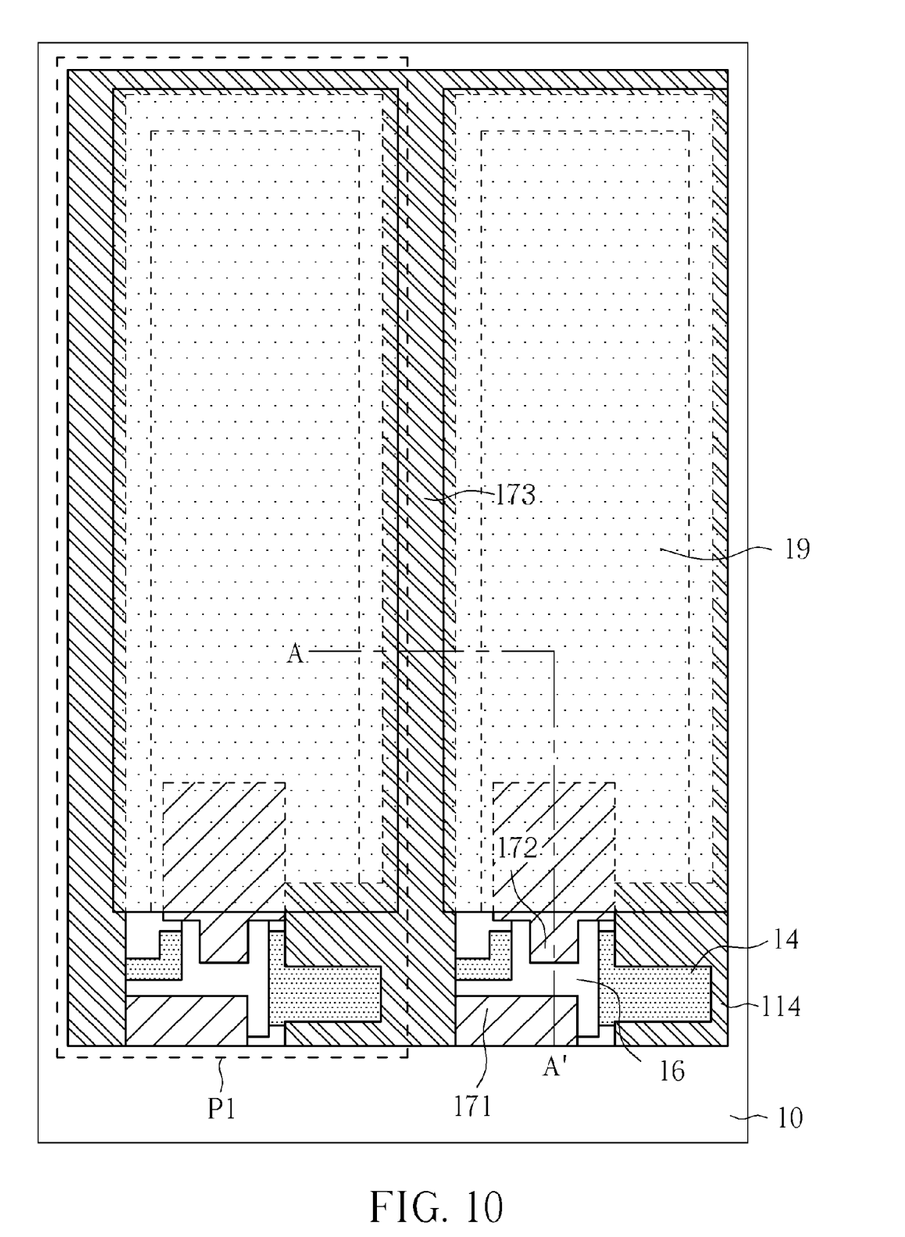

The thin film transistor substrate of the liquid crystal display panel of the present invention is not limited to the first preferred embodiment mentioned above, and may have other embodiments. In order to compare the difference between the embodiments more easily and to describe briefly, in the following second preferred embodiment, same components are denoted by same numerals. Please refer to FIGS. 7-10, FIGS. 7-10 are schematic diagrams illustrating a method of manufacturing a thin film transistor substrate of a liquid crystal display panel of the second preferred embodiment, wherein FIG. 7 is a cross-sectional view taken along line A-A' in FIG. 8, and FIG. 9 is a cross-sectional view taken along line A-A' in FIG. 10. In FIG. 8 and FIG. 10, two pixels are illustrated exemplarily, and one pixel P1 is marked with a dotted frame. As shown in FIG. 7 and FIG. 8, at least one gate electrode 14 is formed on the substrate 10. Next, a gate insulating layer 15, a patterned semiconductor layer 16, a source electrode 171, a drain electrode 172, a data line 173, and a second insulating layer 18 are formed sequentially on the gate electrode 14. Moreover, the first insulating layer 18 has at least one contact hole 181 exposing a part of the drain electrode 172. Thereafter, at least one storage capacitor electrode 11 is formed on the second insulating layer 18 by a method which is substantially the same as the method of the first preferred embodiment. The storage capacitor electrode 11 includes a patterned transparent conducting layer 113 and a patterned opaque conducting layer 114, and an area of the patterned transparent conducting layer 113 is larger than an area of the patterned opaque conducting layer 114.

Next, as shown in FIG. 9 and FIG. 10, a first insulating layer 13 is formed on the storage capacitor electrode 11, and a part of the first insulating layer 13 is removed such that the first insulating layer 13 and the second insulating layer 18 commonly have at least one contact hole 181 exposing a part of the drain electrode 172. Then, at least one pixel electrode 19 is formed on the second insulating layer 18 and on the first insulating layer 13, and the pixel electrode 19 is electrically connected to the drain electrode 172 via the contact hole 181. A part of the pixel electrode 19 overlaps a part of the storage capacitor electrode 11 to form a storage capacitor. By virtue of the aforementioned method, the thin film transistor substrate of the liquid crystal display panel of the second preferred embodiment of the present invention is completed. According to the manufacturing method of forming the thin film transistor substrate of the liquid crystal display panel of the second preferred embodiment, one mask is saved, and process steps are reduced. Also, the electrical difference caused by the misalignment between the patterned transparent conducting layer 113 and the patterned opaque conducting layer 114 is prevented. Moreover, the capacitance of the storage capacitor and the aperture ratio can be both increased by increasing the area of the patterned transparent conducting layer 113, which is optically transmittable.

In conclusion, the thin film transistor substrate of the liquid crystal display panel of the present invention accomplishes the storage capacitor electrode formed by the patterned transparent conducting layer and the patterned opaque conducting layer by using a gray-tone mask. In comparison with the method of forming the patterned transparent conducting layer and the opaque conducting layer by using the process with two masks, one mask is saved, and process steps are reduced. Also, since the patterned transparent conducting layer and the patterned opaque conducting layer are patterned by the same mask, the electrical difference caused by the misalignment between the patterned transparent conducting layer and the patterned opaque conducting layer is prevented. The storage capacitor electrode includes the patterned transparent conducting layer and the patterned opaque conducting layer, and the area of the patterned transparent conducting layer is larger than the area of the patterned opaque conducting layer. Consequently, the capacitance of the storage capacitor and the aperture ratio can be both increased by increasing the area of the patterned transparent conducting layer with high optical transmittance.

Those skilled in the art will readily observe that numerous modifications and alterations of the structure and method may be made while retaining the teachings of the invention.

What is claimed is:

1. A method of manufacturing a thin film transistor substrate of a liquid crystal display, comprising:

providing a substrate;

forming a transparent conducting layer and an opaque conducting layer on the substrate, wherein the opaque conducting layer is disposed on the transparent conducting layer;

using a gray-tone mask to pattern the transparent conducting layer and the opaque conducting layer to form at least one storage capacitor electrode, wherein the storage capacitor electrode comprises a patterned transparent conducting layer and a patterned opaque conducting layer, and an area of the patterned transparent conducting layer is larger than an area of the patterned opaque conducting layer, and wherein the gray-tone mask at least has a first area, a semitransparent area, and a second area, the patterned opaque conducting layer of the storage capacitor electrode is substantially corresponding to the first area, and a part of the patterned transparent conducting layer protruding from the patterned opaque conducting layer of the storage capacitor electrode is substantially corresponding to the semitransparent area;

forming a first insulating layer on the storage capacitor electrode;

forming at least one gate electrode on the substrate;

at least forming sequentially a gate insulating layer, a patterned semiconductor layer, a source electrode, a drain electrode, and a second insulating layer on the gate electrode; and forming at least one pixel electrode on the second insulating layer and on the first insulating layer, wherein a part of the pixel electrode overlaps a part of the storage capacitor electrode to form a storage capacitor.

2. The method of manufacturing the thin film transistor substrate of the liquid crystal display according to claim 1, wherein the gate electrode is formed on the first insulating layer, the second insulating layer has at least one contact hole, and the pixel electrode is electrically connected to the drain electrode via the contact hole.

3. The method of manufacturing the thin film transistor substrate of the liquid crystal display according to claim 1, wherein the storage capacitor electrode is disposed on the second insulating layer, the first insulating layer and the second insulating layer have at least one contact hole, and the pixel electrode is electrically connected to the drain electrode via the contact hole.

4. The method of manufacturing the thin film transistor substrate of the liquid crystal display according to claim 1, wherein steps of patterning the transparent conducting layer and the opaque conducting layer comprise:

forming a photo resist layer on the opaque conducting layer;

performing an exposure process to the photo resist layer by using a gray-tone mask;

after the exposure process, performing an developing process to remove a part of the photo resist layer to form a patterned photo resist layer, wherein a thickness of the patterned photo resist layer corresponding to the first area is thicker than a thickness of the pattern photo resist layer corresponding to the semitransparent area;

removing the opaque conducting layer and the transparent conducting layer uncovered by the patterned photo resist layer;

performing an ashing process to the patterned photo resist layer to reduce the thickness of the patterned photo resist layer corresponding to the first area and to remove the patterned photo resist layer corresponding to the semitransparent area to expose a part of the opaque conducting layer;

removing the opaque conducting layer uncovered by the patterned photo resist layer; and removing the patterned photo resist layer.

5. The method of manufacturing the thin film transistor substrate of the liquid crystal display according to claim 4, wherein the photo resist layer is a positive photo resist layer, the first area is a light-shielding area, and the second area is a transparent area.

6. The method of manufacturing the thin film transistor substrate of the liquid crystal display according to claim 4, wherein the photo resist layer is a negative photo resist layer, the first area is a transparent area, and the second area is a light-shielding area.

\* \* \* \* \*